(12) United States Patent
Lobo

(10) Patent No.: US 7,274,747 B1
(45) Date of Patent: Sep. 25, 2007

(54) PULSE SHAPING WHICH COMPENSATES FOR COMPONENT DISTORTION

(75) Inventor: Natividadel Lobo, Windsor (GB)

(73) Assignee: Nokia Corporation, Espoo (FI)

( * ) Notice: Subject to any disclaimer, the term of this patent is extended or adjusted under 35 U.S.C. 154(b) by 1173 days.

(21) Appl. No.: 09/625,201

(22) Filed: Jul. 21, 2000

Related U.S. Application Data

(63) Continuation of application No. PCT/GB99/00201, filed on Jan. 21, 1999.

(30) Foreign Application Priority Data

| Jan. 21, 1998 | (GB) | .................................... 9801302 |
| Jan. 21, 1998 | (GB) | .................................... 9801305 |
| Jan. 21, 1998 | (GB) | .................................... 9801306 |
| Jan. 21, 1998 | (GB) | .................................... 9801308 |
| Mar. 5, 1998 | (GB) | .................................... 9804600 |
| Mar. 11, 1998 | (GB) | .................................... 9805126 |
| Mar. 12, 1998 | (GB) | .................................... 9805234 |
| Mar. 13, 1998 | (GB) | .................................... 9805504 |
| Jul. 1, 1998 | (GB) | .................................... 9814300 |
| Nov. 6, 1998 | (GB) | .................................... 9824426 |

(51) Int. Cl.
*H04L 27/00* (2006.01)
*H04B 1/707* (2006.01)

(52) U.S. Cl. ...................... 375/295; 375/146; 455/102; 455/553.1

(58) Field of Classification Search ................ 375/342, 375/295, 340, 296, 297, 316, 130, 140, 146; 370/204; 455/91, 102, 553.1, 108
See application file for complete search history.

(56) References Cited

U.S. PATENT DOCUMENTS

| 4,319,359 | A | * | 3/1982 | Wolf .......................... 375/238 |
| 4,600,891 | A | * | 7/1986 | Taylor et al. ................. 330/10 |
| 5,070,254 | A | * | 12/1991 | Summers ..................... 327/105 |
| 5,105,446 | A | | 4/1992 | Ravoalavoson et al. |
| 5,313,494 | A | | 5/1994 | Park et al. |
| 5,572,516 | A | * | 11/1996 | Miya et al. .................. 370/342 |
| 5,701,294 | A | * | 12/1997 | Ward et al. .................. 370/252 |
| 5,712,868 | A | * | 1/1998 | Stern et al. .................. 375/132 |
| 5,748,678 | A | * | 5/1998 | Valentine et al. ........... 375/297 |
| 5,790,516 | A | | 8/1998 | Gudmundson et al. |
| 5,808,511 | A | * | 9/1998 | Kobayashi .................. 330/149 |
| 5,909,460 | A | * | 6/1999 | Dent .......................... 375/130 |
| 6,072,364 | A | * | 6/2000 | Jeckeln et al. .............. 330/149 |
| 7,054,658 | B1 | * | 5/2006 | Lobo ........................ 455/553.1 |

\* cited by examiner

*Primary Examiner*—Kevin Burd
(74) *Attorney, Agent, or Firm*—Alston & Bird LLP

(57) ABSTRACT

A method is provided for defining a pulse function shape for acting on a data stream for transmission in a telecommunication system which compensates for distortion by a component of the transmitter. The method comprises defining desired cost parameters (e.g., error functions for amplitude, BER, bandwidth, energy, AFC) and defining the shape of the pulse function in dependence of the desired cost parameters and the distortion to be compensated for. A pulse generator, modulator and communications device providing such a pulse function are also provided. Application in dual mode TDMA/CDMA system.

33 Claims, 13 Drawing Sheets

PULSE SHAPING WHICH COMPENSATES FOR COMPONENT DISTORTION

CROSS REFERENCE TO RELATED APPLICATION

This application is a continuation of PCT application PCT/GB99/00201, filed Jan. 21, 1999.

BACKGROUND OF THE INVENTION

The present invention relates to a communication device which is provided with pre-distortion to compensate for distortion introduced by components in the device, and a method of such pre-distortion.

In particular, the present invention relates to the compensation of distortion by components in a transmitter.

Components in the transmitter cause an information signal to be distorted prior to transmission to differing degrees. Two major factors affect this distortion, namely ramp up and ramp down, and component tolerances. Whilst individually such distortions may not affect the signal to be transmitted significantly, there is a possibility that the superposition of such signals is unacceptable as it is outside the limits defined by the appropriate telecommunication standard. For example, such distortion may cause a signal in the frequency domain to extend outside the bandwidth defined by a standard.

There are three ways in which compensation of such distortion may be provided. Firstly, during manufacture, each device can be measured, and the devices not meeting the necessary requirements can have the offending components altered. As will be appreciated, this increases manufacturing costs, and results in a reduction in yield over a given time. Secondly, active pre-distortion can be provided, for example on the basis of feedback from the output of a component to be compensated for. However, this increases the complexity of the transmitter and the power consumption. Thirdly, a filter may sometimes be used to compensate for distortion by certain components. However, this is not possible for cases where the distortion varies over a frequency range such as in non-linear devices (for example non-linear power amplifiers).

When designing telecommunication systems, there are a number of modulation schemes which may be selected from. Each one will have its own particular advantages and disadvantages. For example, GMSK (used in GSM) is spectrally inefficient but power efficient, whereas on the other hand QPSK (used in CDMA systems) is spectrally efficient but power inefficient. Distortion by components in the transmitter of a communication device can reduce the benefits of these schemes in practice. For example, GMSK was selected to be used in GSM on the basis that it provides a constant amplitude, and is thus power efficient. However, in practice, distortion of the signal by components in a GSM transmitter will cause variation in the amplitude envelope and thus a variation in power efficiency, so negating at least to some extent the advantages for which GMSK was chosen.

SUMMARY OF THE INVENTION

According to the present invention, there is provided a method for defining the relationship between frequency and amplitude of a pulse function for acting on a data stream for transmission in a telecommunications system to compensate for distortion by a component of the transmitter, the method comprising:

defining desired cost parameters on the basis of the telecommunications system requirements and the distortion to be compensated for; and defining the amplitude of the pulse function over a range of frequencies in dependence on the desired cost parameters and the distortion.

This method enables the designer to select from an expanded choice of components for use in the transmitter. For example, it may enable a designer to use a more efficient power amplifier, because the method provides pre-distortion to compensate for any variation in efficiency. Also, this same distortion can be used for each transmitter designed, and thus eliminates the need for testing and modifying individual devices during manufacture. Furthermore, once the defined pulse function has been implemented in a transmitter there is no need for further pre-distortion compensation. That is, there is no active pre-distortion—this method provides a single step static pre-distortion.

The invention is particularly advantageous when compensating for non-linear distortion. Non-linear distortion may result by virtue of the component itself being non-linear. In this case, the compensation can be targeted at the particular frequencies where maximum distortion occurs. Compensation may be for a power amplifier. This will enable a more efficient power amplifier to be used, thus reducing power consumption of a communication device. This is made possible by the method as the power amplifier can operate in its non-linear region without having to suffer the consequences of non-linearity as this is compensated for.

Alternatively, non-linear distortion can arise when determining a pulse function which is suitable for components (linear or non-linear) having different tolerance values. This is advantageous in that the same pulse function can be used in devices employing different components. It does not, for example, need to be ascertained for each type of device before it can be put on the production line.

A suitable pulse function for compensating for non-linear distortion can be readily determined by minimising the distortion function symbolically (as opposed to numerically). Values can then replace the symbols to determine the actual amplitude values for given frequencies for a particular transmitter.

According to other aspects of the present invention, there is provided a transceiver for a communication device comprising such a modulator and a emodulator, and a communication device, comprising such a transceiver.

According to a still further aspect, there is provided a dual mode communication device operable in a first mode in a TDMA telecommunications system in which a channel is a combination of frequency and timeslot and a second mode in a CDMA telecommunications system, comprising a modulator for modulating a data stream with a carrier signal in accordance with a predetermined modulation scheme in both the first and second modes of operation and a pulse function generator for shaping a data stream in accordance with respective pulse functions responsive to the mode of operation of the radio telephone and distortion by a component of the transmitter.

According to another aspect, there is provided a dual mode communication device operable in a first mode when a first set of cost parameters are desired and in a second mode when a second set of cost parameters are desired, the radiotelephone comprising:

a first pulse function generator for converting a data stream in accordance with a pulse function shaped in dependence on the first set of desired cost parameters;

a second pulse function generator for converting a data stream in accordance with a pulse function shaped in dependence on the second set of desired cost parameters; and means for selecting the pulse function generator in accordance with the mode of operation of the phone;

wherein at least one of the pulse functions is shaped in accordance with the relationship defined by any of the above methods.

The present invention may be used to compensate for one or plurality of components. This method reduces the mathematical complexity in determining the level of distortion to be compensated for by two components. In a preferred embodiment, the telecommunication system is GSM, the first component is a reconstruction filter and the second a non-linear power amplifier. In this case, firstly the pulse function required for compensation of the reconstruction filter is determined, and then a second pulse function which would result in the reconstruction filter compensation pulse function is compensating for the power amplifier.

Desired cost parameters may be defined on the basis of a number of telecommunication system requirements, including TDMA and CDMA. One type of TDMA system is GSM, and a pulse function may be defined according to the method of the present invention such that a conventionally shaped Gaussian pulse may be transmitted. Alternatively, the pulse function may be defined to take other cost functions into account.

Similarly, for CDMA, the pulse function may be defined conventionally such that a pulse of a root raised cosine shape may be transmitted, or alternatively the pulse function may be defined to take other cost functions into account.

According to another aspect of the present invention, the defined pulse function is generated by a pulse function generator.

According to a further aspect of the present invention, a modulator is provided which comprises means for shaping a data stream in accordance with the defined pulse function.

The means for shaping a data stream advantageously comprises a look-up table.

This communication device may be operable at a first data rate in the first mode and a second data rate in the second mode. Preferably the first data rate supports voice applications and the second data rate supports data applications.

According to a further aspect of the present invention, there is provided a dual mode communication device operable in a first mode when a first set of cost parameters are desired and in a second mode when a second set of cost parameters are desired, the radiotelephone comprising:

a modulator for modulating a data stream with a carrier signal in accordance with a predetermined modulation scheme in both the first and second modes of operation;

a first pulse function generator for shaping a data stream in accordance with a pulse function shaped in dependence on the first set of desired cost parameters and distortion by a component of the transmitter;

a second pulse function generator for shaping a data stream in accordance with a pulse function shaped in dependence on the second set of desired cost parameters and distortion by a component of the transmitter; and means for selecting the pulse function generator in accordance with the mode of operation of the phone.

According to yet another aspect of the present invention, there is provided a method for selecting a modulation scheme for a communication system using a predetermined transmitter, the method comprising:

defining a pulse function for a first modulation scheme in accordance with any of the aforementioned methods;

defining a pulse function for a second modulation scheme for the same desired cost parameters;

the other declines in a determined fashion. That is, there is no scope for altering the bandwidth without the detriment of power inefficiency.

Because of the severe restrictions placed on the trade-offs achievable by varying the single variable for the predetermined mathematical functions, the pulse shape most appropriate for each modulation scheme is quite clear. The system designer conventionally makes a decision on which modulation scheme based on its strengths and weaknesses and selects the appropriate pulse shape based solely on that chosen modulation scheme (i.e. a Gaussian for GMSK and a root raised cosine for QPSK). He does not take distortion of the ideal pulse shape into account when determining the modulation scheme to be used. The single variable of the mathematical function is set to provide an acceptable balance in the defined relationship between the cost parameters.

In the present invention, there is no predetermined mathematical relationship for the pulse shaper. The shape of the pulse is defined in order to compensate for distortion by one or more transmitter components. There is freedom to select new pulse shapes that compensate for distortion so that the transmitter can transmit a signal of appropriate (potentially ideal) shape for the chosen modulation scheme, such as a Gaussian or root raised cosine.

In a preferred embodiment, pulse shapes may be chosen which provide for compensation, and furthermore allow many cost parameters to be balanced against each other since the trade-off relationship between two parameters is no longer defined so restricted. This leads to a number of interesting possibilities, which will be outlined below.

With this preferred embodiment of the present invention, it is not necessary for the pulse shape in MSK to be gaussian. Although this particular pulse determining the resultant cost parameters for each scheme; and selecting the modulation scheme which gives good resultant cost parameters given the desired ones.

In prior art modulation schemes, the pulse functions used to shape the data streams have had a predefined mathematical relationship.

For example:
root raised cosine $$H(f) = 1 \qquad |f| < \alpha$$

$$H(f) = \sqrt{\frac{1}{2}(1 - \cos(2\Pi(f - (T + \alpha)))} \qquad \alpha < |f| \le T + \alpha$$

$$= 0 \qquad |f| > T + \alpha$$

for CDMA systems in which QPSK modulation is used and PDC and NADC systems in which DQPSK modulation is used.

Gaussian $$H(f) = \frac{1}{\sqrt{2\Pi}\,\sigma} e^{\frac{-f^2}{2\sigma^2}}$$

for GSM in which an MSK modulation scheme is used.

With pulse shapes according to the conventional predefined mathematical relationships only one parameter is variable for a given energy level. For the gaussian pulse this is 'sigma' that varies the spread of the pulse allowing the bandwidth to alter at the expense of amplitude. For the root raised cosine the variable is 'alpha' that varies the frequency at which the cosine tail begins. This effects the bandwidth and consequently the power efficiency. The relationship between the cost parameters is well defined so as one improves shape optimizes performance in terms of power efficiency it is not optimal in terms of spectral efficiency. By deviating from a gaussian shape in the frequency domain the balance between BER, power efficiency and bandwidth alters. The same applies to the consequences of deviations from the root raised cosine pulse shape in QPSK modulation.

Pulses in both the MSK system and the QPSK system can be shaped to provide a desired balance between cost functions (e.g. BER, bandwidth, power efficiency, AFC) rather than being at the mercy of existing trade-offs when only the parameters of a given shape pulse such as a gaussian or a root raised cosine are modified. Cost functions are functions which are positive and get smaller the better a system operates.

Simulations demonstrate that by experimenting with the pulse shape used for MSK modulation the spectral efficiency of the GSM system can be enhanced while retaining an acceptable power efficiency. This allows the existing GSM system to be enhanced to increase data rate using existing frequency bands by dividing existing channels, a channel being a combination of frequency band and timeslot.

The present invention suggests that the pulse shape in a modulation scheme can be used to alter the cost functions (parameters) of the scheme as well as to provide predistortion. This can be utilised in a number of ways. It allows existing modulation schemes to be looked at afresh with new pulse shapes to obtain performances that are better than those possible at present with conventional pulse shapes. By removing the strong links between particular modulation schemes and the current problems, e.g. MSK—spectral inefficiency; QPSK—power inefficiency, the modulation schemes for particular systems could be selected on a different basis.

For example, by implementing CDMA using a MSK modulation scheme with a suitable pulse shape to meet the required cost function i.e. (CDMA criteria) a dual mode GSM CDMA terminal could be constructed using a single modulator. The pulse shape would be likely to differ for each system as the cost function (desired parameters) may also differ.

The invention also allows problems with existing systems to be ameliorated. The major problem with the existing GSM system is that as data users increase they will occupy an increasing fraction of available channels. This is because if data transmission rates are to match expectations, more than one channel is needed to transmit data. If the data rate requirements are met, as the fraction of data users increases, the capacity of the system decreases. If GSM is to continue to support both voice and data users, without grinding to a halt, the number of operable channels needs to increase.

This increase in operable channels can be achieved by modifying the pulse shape in the MSK modulation scheme to reduce the relevant cost function i.e. bandwidth or bit error rate.

To support a faster data rate within existing channels, a channel can be divided either in time so that more than one frame is sent in a single time slot. Alternatively the channel could be divided in frequency to allow more than one frequency band to be sent in an existing (wider) frequency band. A data user could then send data at a faster rate by using 'subchannels' within a channel allocated by the system without reducing the capacity of the system. Without the subchannels the only way the data rate could be increased would be by using more than one channel to transmit data. For every additional channel utilised, there would be a corresponding reduction in the number of channels available, for both voice and data transmissions.

The two types of user, fast data rate and slow data rate could co-exist in the same system with only minimal changes to the GSM infrastructure (e.g. software). The proposed half rate GSM could be used, in which a half rate channel (where only one slot every other frame is dedicated per subscriber) is used for slow data rate users, This arrangement would accordingly allow GSM to evolve to become useful as a high data rate system, extending its practical life. In GSM there are 8 timeslots and 175 frequency bands. By dividing each channel into two up to twice the users could be accommodated on the existing channel. This would significantly effect the future data user capacity of the system As well as using MSK modulation in a CDMA system, pulse shaping would allow the cost functions in a QPSK modulation scheme to be optimized. This would allow the power efficiency to increase with perhaps some resulting increase in the BER and decrease in spectral efficiency. The freedom to select a pulse shape unconstrained by conventional root raised cosines and gaussian pulses allows the cost function in any of these modulation schemes to be optimized to meet desired parameters. This provides greater freedom in designing a third generation or enhanced second generation system, having desired parameters that are considered as set of weighted costs in an optimization calculation.

By experimentation, optimization could be tried for any modulation scheme and the results examined to determine the 'best' optimization for a predetermined cost function.

BRIEF DESCRIPTION OF THE DRAWINGS

Embodiments of the invention will now be described, by way of example, with reference to the accompanying drawings, of which.

DETAILED DESCRIPTION OF THE INVENTION

Figure 1A:
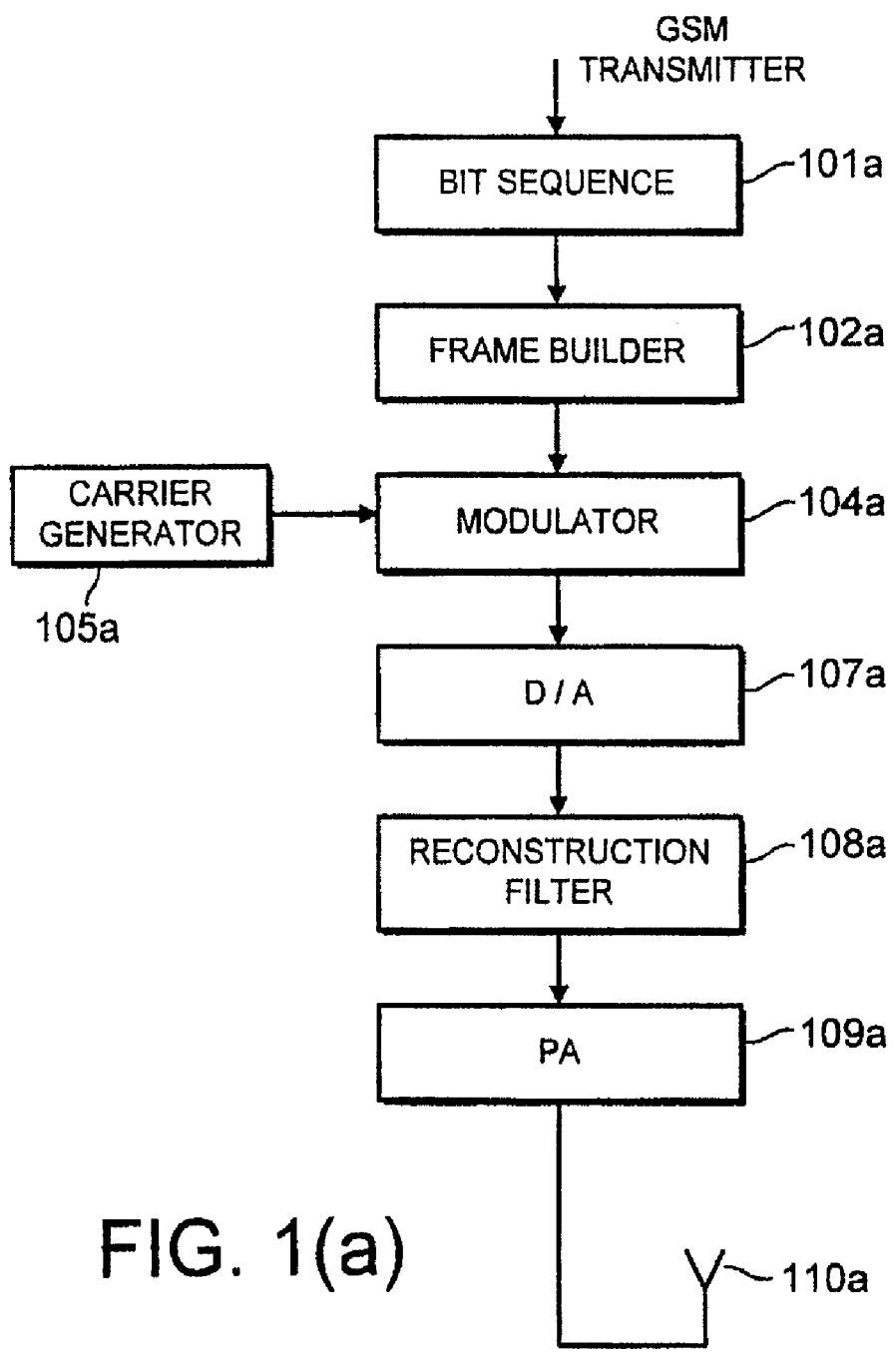
FIG. 1(a) illustrates a conventional GSM transmitter.

FIG. 1a illustrates a GSM transmitter. GSM conventionally comprises a frame structure as shown in FIG. 1c. A bit sequence 101a to be transmitted is input to a frame builder 102a of the transmitter, which puts the bits in the appropriate portion of a burst within a time slot of a TDMA frame. The bit stream is then forwarded to a modulator 104a. Conventionally this modulator would be a GMSK modulator, and thus the signal would be put through a Gaussian filter. A clock or carrier generator 105a provides the carrier signal. The modulated signal is input to a digital analogue converter 107a. This analogue signal is then reconstructed by reconstruction filter 108a. This filter might typically comprise a switch capacitor filter for performing some of the spectral shaping and an analogue filter, such as an RC filter, for mainly dealing with residual shaping. Finally, the signal is amplified by a power amplifier 109a and is transmitted via antenna 110a.

Figure 1B:
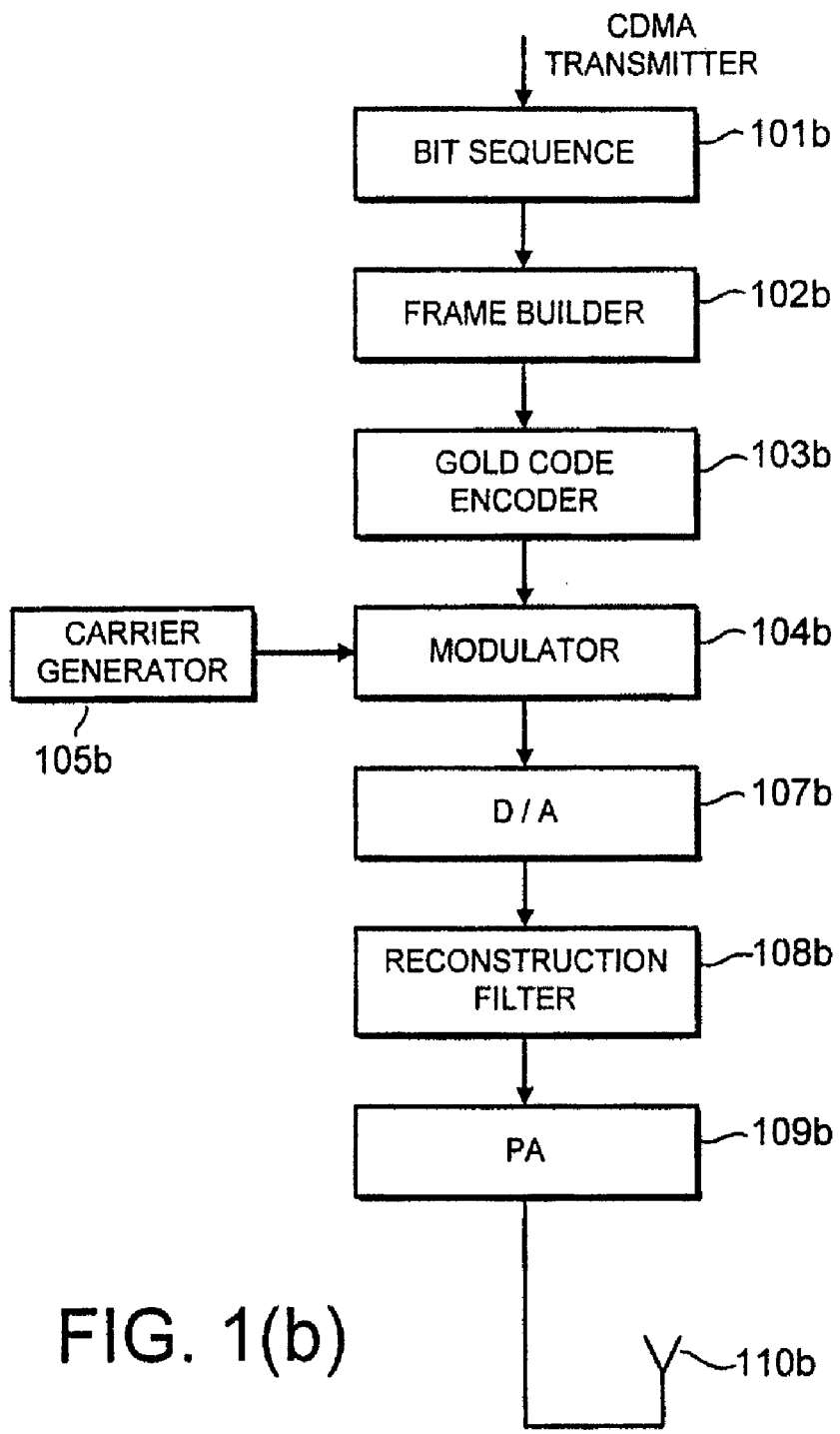
FIG. 1(b) illustrates a conventional CDMA transmitter.
Figure 1C:
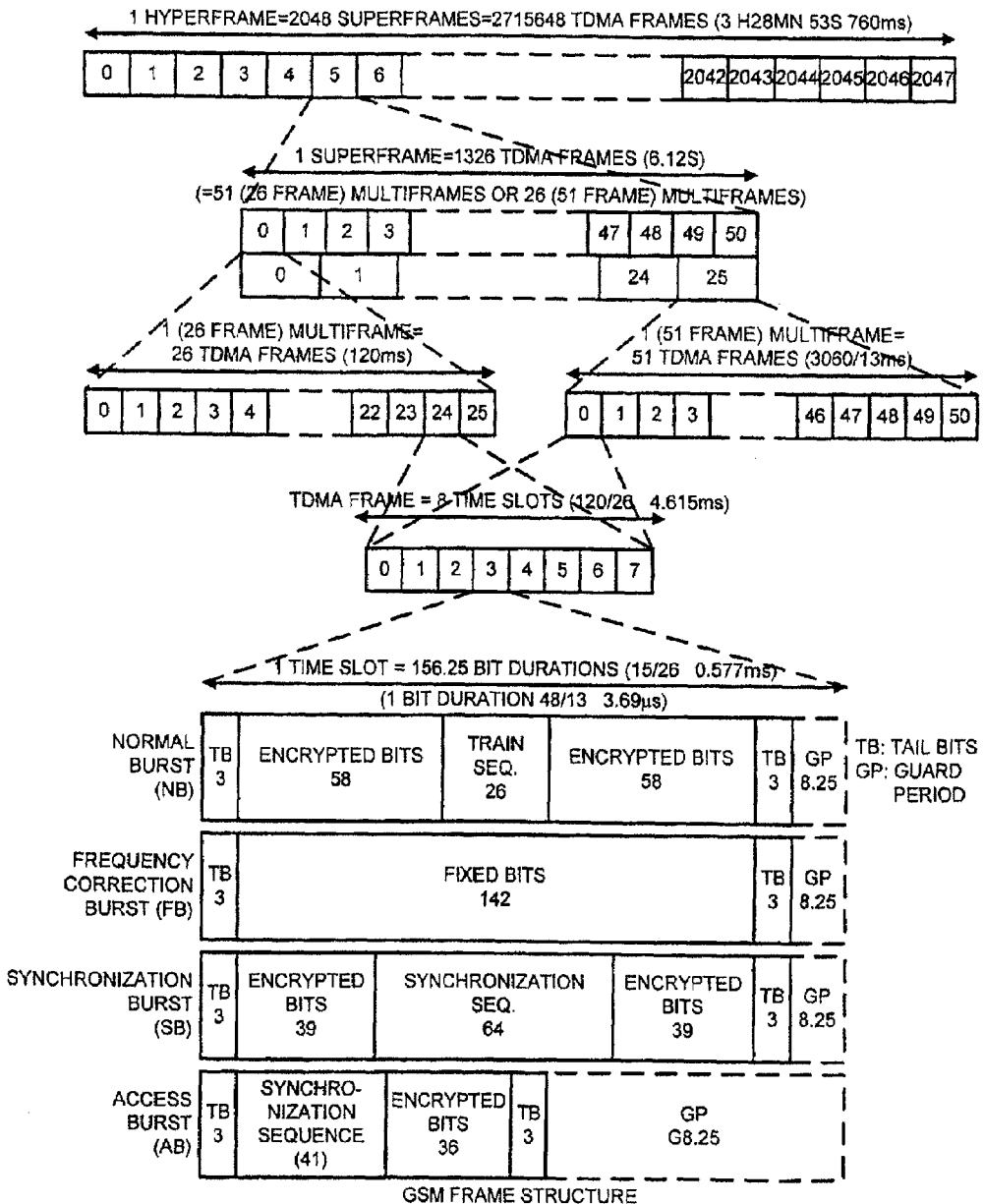
FIG. 1(c) shows the GSM frame structure.

FIG. 1(b) illustrates a conventional Code Division Multiple Access (CDMA) transmitter. CDMA conventionally comprises a frame made up of a dedicated physical data channel (DPDCH) and a dedicated physical control channel (DPCCH). A bit sequence 101b to be transmitted is input to a frame builder 102b of the transmitter, which puts the bits in the appropriate part of the frame (i.e. in the DPDCH).

The bit stream is then spread across the spectrum by the Gold Code Encoder. This Gold Code Encoder 103b operates as follows.

Given $\{_0, C_1 \ldots C_{N-1}\}$ bit stream and $\{f_0 f_1 \ldots f_{M-1}\}$ frame sequence (i.e. M symbol bits)

the output of the Gold Code Encoder 103b is a sequence with N×M terms having the following elements:

$\{f_0 C_0, f_0 C_1, \ldots f_0 C_{N-1}, f_1 C_0 \ldots f_1 C_{N-1} \ldots$ $\ldots f_{M-1} C_{N-1} \ldots f_{N-1} C_{M-1}\}$ Hence, there are MN chips to modulate.

A modulator 104b modulates these MN chips output by the Gold Code Encoder 103b on to a carrier, which is output by clock or carrier generator 105b. The modulator 104b is a QPSK modulator, as is generally used in CDMA systems such as IS95, and outputs a signal having a root raised cosine pulse function. The output of the modulator 104b is input to a digital to analogue converter 107b. The analogue signal is then reconstructed by a reconstruction filter 108b. A reconstruction filter might typically comprise a switch capacitor filter for performing some spectral shaping and an analogue filter, such as an RC filter network, for mainly dealing with residual shaping. Once the signal has been reconstructed, it is input to a power amplifier 109b, which amplifies the signal for transmission by the antenna 110b.

In practice, the signal output by the antenna 110a,b of these systems will not be of ideal Gaussian/root raised cosine shape due to its' distortion by components of the transmitter. Compensation of such distortion may be provided as outlined in the description of the background of the invention. However, as explained these solutions have disadvantages associated with them. According to the present invention, a new method of predistortion is provided in which the modulator modulates the information signal with a pulse shaped to compensate for distortion by one or more of the transmitter components. This will be explained further with reference to FIGS. 2 and 3 below.

Figure 2:
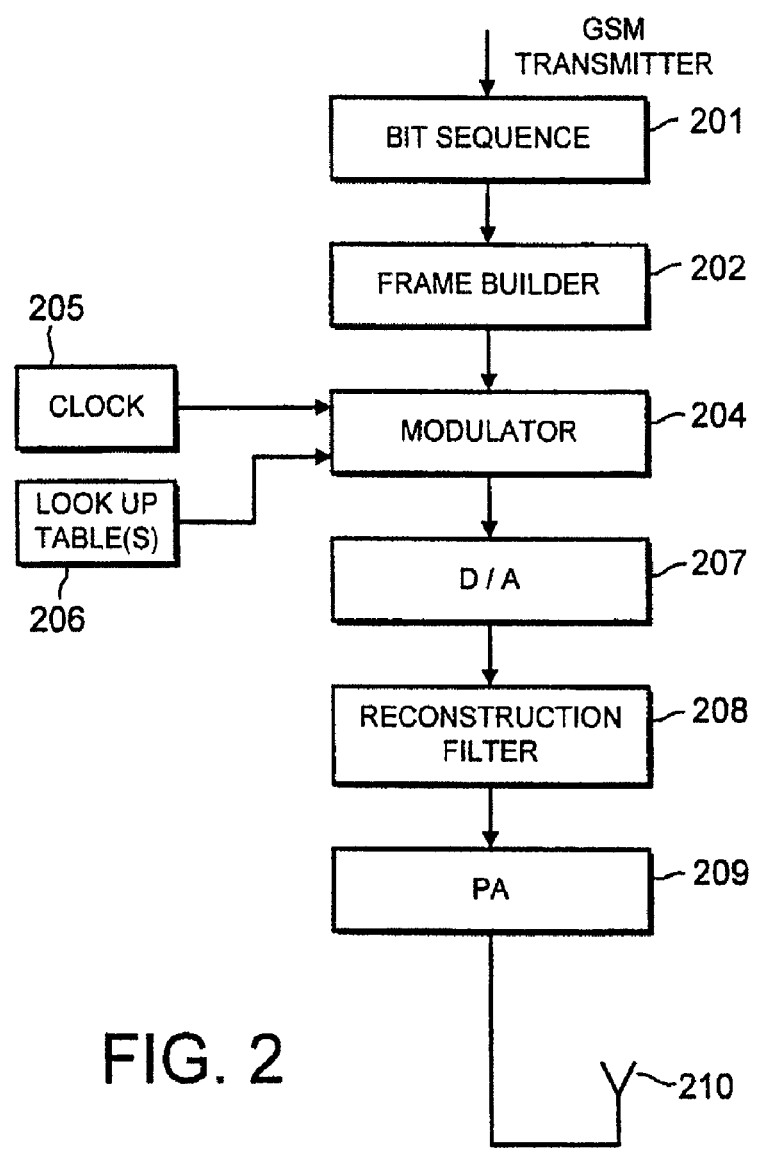
FIG. 2 illustrates a GSM transmitter according to an embodiment of the present invention.

FIG. 2 illustrates a GSM transmitter according to an embodiment of the present invention. A number of components of the transmitter correspond to those of the conventional GSM transmitter shown in FIG. 1(a): the bit sequence 201, frame builder 202, modulator 204 and D/A converter 207, reconstruction filter 208, power amplifier 209 and antenna 210 correspond to their counterparts 101a, 102a, 104a, 107a-110a respectively. The main difference lies in the means for providing the modulator with a carrier. The carrier generator 105a of the conventional transmitter, which provides a Gaussian signal in the frequency domain, is replaced with a clock 205 and a look up table 206 comprising data for adaptively shaping the pulse function to compensate for component distortion.

Figure 3:
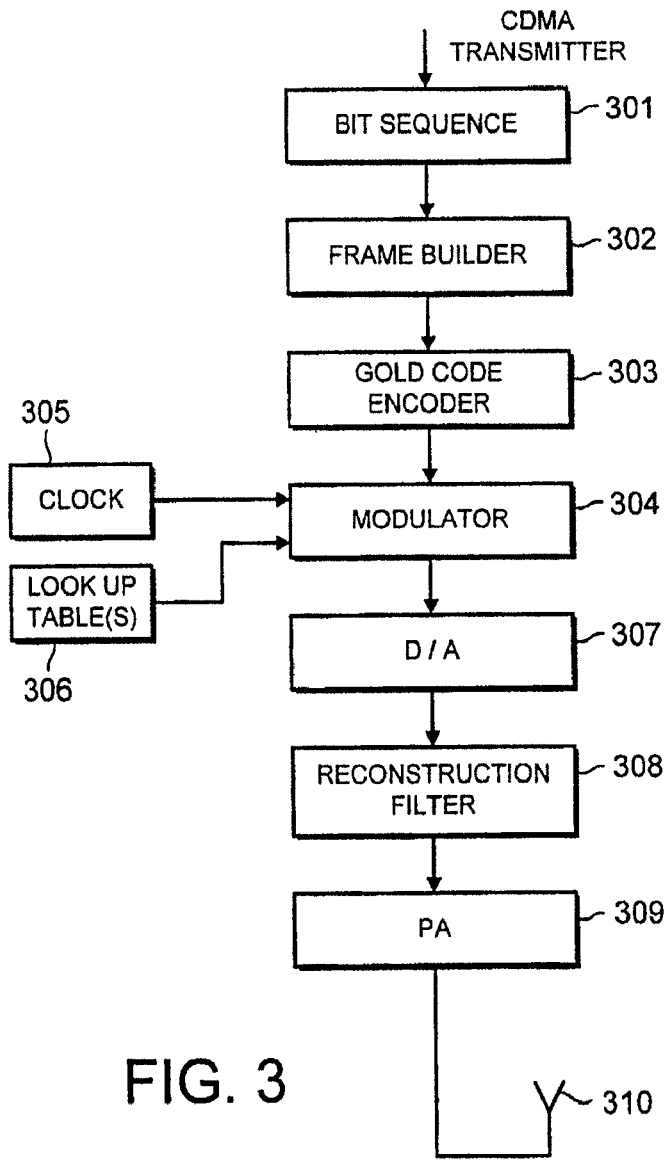
FIG. 3 illustrates a CDMA transmitter according to an embodiment of the present invention.

Likewise, FIG. 3 illustrates a CDMA transmitter according to the present invention, in which the main difference over the transmitter of FIG. 1(b) lies in the means for providing the modulator with a carrier. In this case, the carrier generator 105b of the conventional CDMA transmitter, which provides a root raised cosine signal in the frequency domain, is replaced with a clock 305 and a look up table 306 comprising data for adaptively shaping the pulse function to compensate for component distortion.

The look-up table comprises data defining the amplitude of the pulse function over a range of frequencies which meet the telecommunications system requirements and compensate for component distortion.

The values for the look up table need only to be calculated once for each type of device.

Figure 4A:
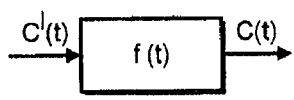
FIG. 4(a) is a block diagram illustrating terms used in compensating for a single component.

FIG. 4(a) is a block diagram illustrating the terms used in an initial equation which compensates for a single component. F(t) is the symbol reflecting the function of the component (e.g. reconstruction filter) to be compensated for, C(t) is symbol indicative of the desired pulse to be output (for example a Gaussian pulse in GSM or a root raised cosine pulse in CDMA), and C'(t) is the symbol reflecting the pulse required to compensate for distortion by the component.

The distortion function for such a component is defined by:

$$\int_{-\infty}^{\infty} \{C'(t) * F_1(t) - C(t)\}^2 \, dt \qquad (1)$$

This distortion (cost) function can be solved using any standard equation solving technique. That is, the distortion cost function is minimised. Numeric values can then replace the symbols to determine the actual value of C'(t) for a particular type of transmitter.

Figure 4B:
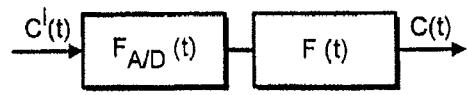
FIG. 4(b) is a block diagram illustrating terms used in compensating for two components, namely an A/D converter and a reconstruction filter.

FIG. 4(b) is a block diagram illustrating the terms used in an initial equation which compensates for a plurality (in this case two) components. $F_{A/D}(t)$ is the symbol reflecting the function of an A/D converter filter to be compensated for, $F_{REF}(t)$ is the symbol indicative of the function of a reconstruction filter to be compensated for, C(t) is the symbol for desired pulse to be output (for example a Gaussian pulse in GSM or a root raised cosine pulse in CDMA), and C'(t) is the symbol for the pulse required to compensate for distortion by the components.

In this case, the distortion function for the components is defined by:

$$\int_{-\infty}^{\infty} \{(C'(t) * F_{A/D}(t)) * F_{REF}(t) - C(t)\}^2 \, dt \qquad (2)$$

Figure 4C:
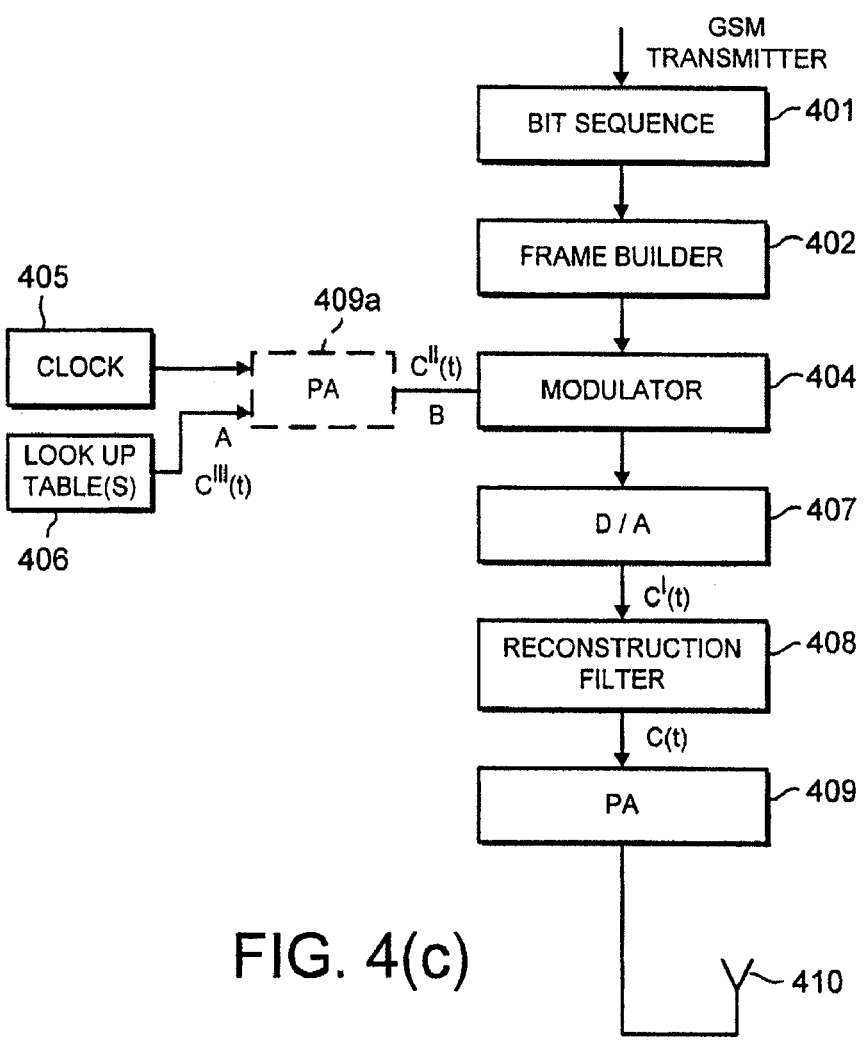
FIG. 4(c) illustrates a GSM transmitter according to an embodiment of the present invention.

Again, this distortion (cost) function can be determined using any standard equation solving technique. That is, the distortion function is minimised. Numeric values can then replace the symbols to determine the actual value of C'(t) to be stored in the look-up table of a particular transmitter. The components may be treated as a composite, or they may be compensated for individually. The latter technique is useful, for example, to reduce the mathematical complexity in solving the equations, and is exemplified with respect to the GSM transmitter of FIG. 2, as shown in FIG. 4(c). In this case, predistortion of the power amplifier 409 and the reconstruction filter is required. The power amplifier is treated as having been removed from the path between the modulator 404 and the antenna 410, to a position between the look up table 406 and the carrier input of the modulator 404, as indicated in dotted lines in FIG. 4(c). Firstly the predistortion to compensate for errors caused by the reconstruction filter 408 is determined by solving equation 1 above, where F(t) is the function of the reconstruction filter 408. The resultant pulse C'(t) is then used as the desired output pulse from the imaginary power amplifier 409a at point B and predistortion to compensate for errors caused by the power amplifier is determined by solving equation 1 above (where F(t)=function of the power amplifier, C(t)=C" (t) and C'(t)=C'"(t)). That is, the distortion function is minimised and numeric values of the resultant pulse are stored in look-up table 406 for application at point A.

In a preferred embodiment of the invention, a cost function is determined which will provide the optimum predistortion over a range of tolerance values. This is applicable to both linear and non-linear devices, and enables a single look-up table to be used for a variation of components. Hence, it avoids the need to measure individual devices during manufacture. For example, the cost function may be defined by:

$$\alpha \int_{-\infty}^{\infty} \{C'_1(t) * F_1(t) - C(t)\}^2 +$$
$$\beta \int_{-\infty}^{\infty} \{C'_2(t) * F_2(t) - C(t)\}^2 +$$
$$\delta \int_{-\infty}^{\infty} \{C'_3(t) * F_3(t) - C(t)\}^2 +$$

where $F_1$ is the function of the component having a first tolerance value to be compensated for;

where $F_2$ is the function of the component having a second tolerance value to be compensated for;

where $F_1$ is the function of the component having a third tolerance value to be compensated for;

C(t) is the desired pulse to be output;

$C_1'(t)$ is the pulse required to compensate for distortion by the component having the first tolerance value;

$C_2'(t)$ is the pulse required to compensate for distortion by the component $C_3'(t)$ is the pulse required to compensate for distortion by the component having the third tolerance value; and α, β and δ are weighting factors.

Typical tolerance values for the components might be:

| First value | +5% |
|---|---|
| Second value | 0% (ideal) |
| Third value | −5% |

The weighting factors can be varied so as to tailor the results. Values for the cost function are then determined which minimise the cost function and thus give a pulse shape which compensates for distortion over the range of tolerance values (e.g. +5% +0-5%).

Figure 5A:
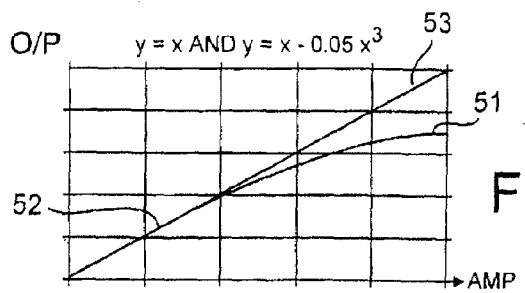
FIG. 5(a) shows the characteristics of an ideal and a typical amplifier.

A preferred embodiment of the invention will now be described with reference to FIG. 5, in which distortion in the form of non linearities of a power amplifier are compensated for. FIG. 5(a) shows the characteristics of a typical power amplifier against the ideal linear amplifier 53. At low amplitudes, the power amplifier is linear as indicated by the part of the line 52, and there is thus a linear relationship between amplitude and output power. Ideally, this linear relationship would be maintained at higher amplitudes as indicated by the line 53. However, in practice, power amplifiers have a non linear region at higher amplitudes, as indicated by the curved part 51. Variations occur primarily due to the use of inexact component values and during ramp up and ramp down of the burst. It is more power efficient to operate power amplifiers in this non linear region. However, this sacrifices the constant amplitude of a signal, and thus systems such as GSM have conventionally been forced to use power amplifiers operating in a less efficient, but more linear region. However, in the present embodiment, the power amplifier is chosen to operate in its more power efficient, yet non-linear region. The non-linearity of this power amplifier is around 5%, and predistortion is determined as follows, so that it can be input in the look up table 206 of FIG. 2 to counteract this non-linearity.

Consider a signal $S_t$ passing through the non-linear amplifier. The signal at the output is:

$$S_t + \alpha S_t^2$$

Then the Fourier transform of the output is:

$$S_f + \alpha(S_f \cdot S_f)$$

Now, compensation for this distortion can be determined. It is assumed that there is a function $h_t$, such that the following equation is true in the spectral domain:

$$H_f + \alpha(H_f H_f) = S_f$$

This equation can be solved using any standard method.

Figure 5B:
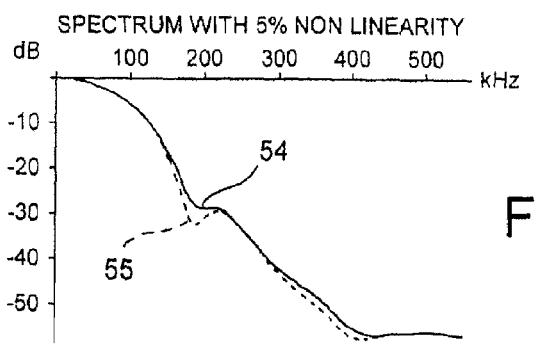
FIGS. 5(b) to (d) show required, uncompensated and compensated spectrums of the typical amplifier.
Figure 5C:
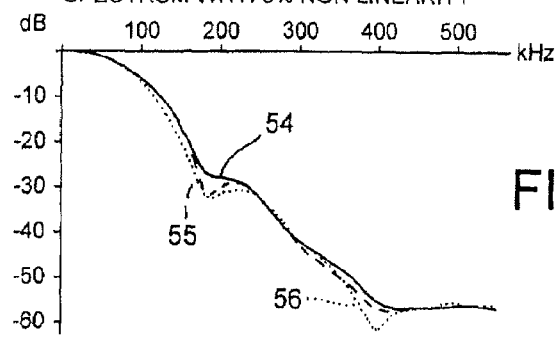
Figure 5D:
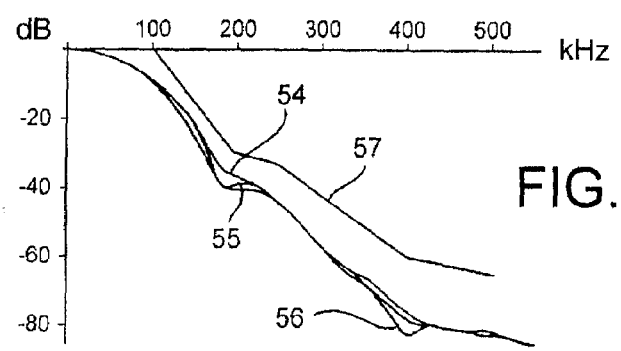
Figure 6A:
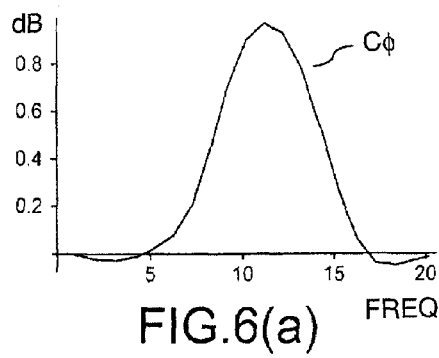
FIGS. 6(a) and (b) illustrate pulse shapes which provide predistortion for a typical power amplifier.
Figure 6B:
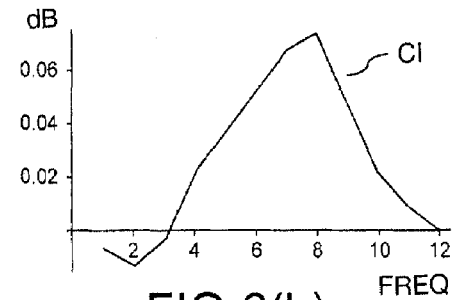
FIGS. 6(c) to (f) illustrate the uncompensated, ideal and compensated spectrum of the typical power amplifier.
Figure 6C:
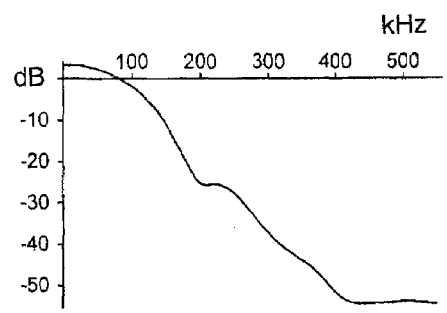
Figure 6D:
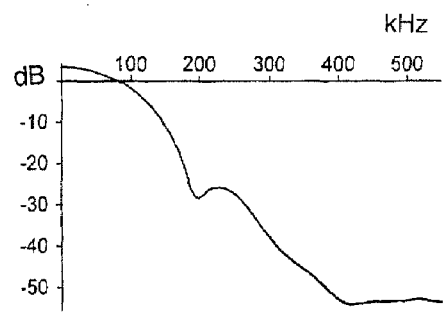
Figure 6E:
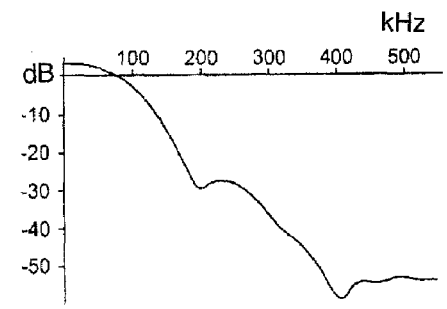
Figure 6F:
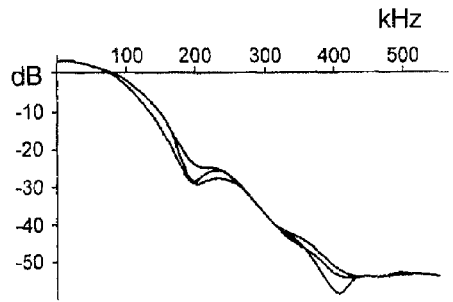

The distortion caused by a non linear amplifier and its compensation are exemplified in FIGS. 5(b) to (d).

FIG. 5(*b*) compares the spectrum of a non linear amplifier 54 with a linear one 55. The plot 54 shows the effect of the spectrum of a non linear power amplifier, where the AM to AM distortion is expressed as $\alpha_0 + \alpha_1 x + \alpha_2 x^2$ with $\alpha_2/\alpha_1 = 0.05$.

FIG. 5(*c*) shows the result of using pulses that have been derived to compensate for the non linearity using a conventional optimisation procedure, for example as described with reference to FIG. 4 above. As can be seen, the predistorted (compensated) power amplifier has a narrower spectrum than the non compensated power amplifier. Indeed, it even overcompensates at the regions where variations in amplitude are most rife during ramp up and ramp down, namely at around 200 kHz and, more critically, at around 400 kHz.

In this embodiment compensation has only been provided for the power amplifier. FIG. 5(*d*) illustrates the spectrum including distortion from the reconstruction filter (this component is likely to cause a substantial amount of the overall transmitter component distortion), and also shows the GSM mask, 57. In reality, distortion from other transmitter components may cause the spectrum of the uncompensated non-linear amplifier to shift outside the GSM mask 57, and thus preventing the transmitter from being allowed for use in the GSM system. However, the power amplifier compensation of this embodiment is sufficient to ensure that the total distortion by transmitter components does not cause this to happen since there is a clear margin between the spectrum 56 (which already includes the reconstruction filter distortion), and the mask 57. In other embodiments, if necessary, compensation could alternatively be provided for a number of transmitter components. This could either be done at the same time as the power amplifier compensation, before or afterwards.

As mentioned above, only the Gaussian and root raised cosine pulses have been considered for use in modulators of telecommunications systems to date. Laurent has suggested that a Gaussian pulse can be approximated by the superposition of AM pulses ($C_0$, $C_1$ ... etc.), these pulses being a fixed family of pulses which are functions of cos and sin. In a preferred embodiment of the present invention, a totally different approach has been taken, as is outlined below.

Laurent's theory that a pulse can be approximated by the superposition of components has been implemented. However, instead of using this theory to approximate existing Gaussian pulses based on the fixed function components, Laurent's superposition expansion has been used as the basis of ascertaining a pulse shape which meets the criteria required by a particular communications system and provides compensation for distortion by one or more components of the transmitter. This may be done as follows.

Firstly, the fixed function components in Laurent's superposition expansion are replaced by one or more functions representing respective unknown pulse components. Then cost functions are looked at (e.g. component distortion such as non linearity, BER, bandwidth, amplitude, AFC). That is, the errors from the values that the particular system requires and the amount of predistortion to be compensated for are considered. The weightings of the cost functions can be varied so as to tailor the results. Values for each function are then determined, for example using an optimiser, which minimise these cost functions and thus give a pulse shape which meets the specified system requirements. In the embodiment illustrated in FIG. 6, the steps required to obtain an appropriate frequency spectrum taking into account power amplifier distortions are as follows:

1. Predistort two Laurent pulses, C0 and C1 to compensate for reconstruction filter tolerances and A/D specifications;
2. Express the values of the compensated pulses required to obtain as close to an ideal spectrum as possible as unknowns;
3. Determine the function of the power amplifier—in this case the power amplifier is taken to have a second order non linearity, i.e. $\alpha_1 x + \alpha_2 x^2$
4. Perform an optimising routine to determine the unknowns.
5. Substitute numeric values to the resultant equation to determine the values to input in the look-up table.

This is further exemplified in the simulation shown in Annex 1.

FIGS. 6(*a*) and (*b*) show the results of the optimisation, FIG. 6(*a*) showing the requisite first distorted Laurent pulse C0 and FIG. 6(*b*) showing the second, C1. FIG. 6(*c*) illustrates the spectrum of an uncompensated power amplifier having a 5% non linearity, and FIG. 6(*d*) illustrates the desired ideal spectrum of the output signal (i.e. that of an ideal linear power amplifier). FIG. 6(*e*) shows the spectrum of a power amplifier compensated in accordance with the unknowns determined by the above process and FIG. 6(*f*) shows the three spectrums illustrated in FIGS. 6(*c*) to (*e*) together for comparison.

The replacement of fixed function components in Laurent's superposition expansion by one or more functions representing respective unknown pulse components can be extended beyond determining appropriate pulse shapes for providing predistortion. In a preferred embodiment, appropriate pulse shapes are determined which, as well as providing for predistortion, also provide improved cost functions than would be obtained using conventional shaped pulses in telecommunications system (e.g. better than would be obtained using a Gaussian pulse shape for GSM or root raised cosine for CDMA). The pulse shaping can be determined in a single optimising step, or in consecutive steps. Firstly, a first pulse shape which meets the cost function requirements other than distortion error could be determined, for example as will be explained below, followed by determination of the pulse shape which would result in that first pulse shape taking into account component distortion.

Preferably two cost functions are used as this provides more optimal pulse shaping than just using one function, and in this regard, the method of determining the appropriate pulse shape can be implemented as follows:

Firstly, Laurent's formula is considered. According to Laurent's formulation:

$$S_{NT+\Delta T} = \sum_{K=0}^{M-1} \sum_{n'=0}^{L_{k}-1} J^A K, N - n' C_{K,n'T+\Delta T} \qquad \text{Equation (1)}$$

where S(t) is the signal at time t $$A_{K,N} = \sum_{n=-\infty}^{N} a_n - \sum_{i=1}^{L-1} a_{N-i} \cdot \alpha_{K,i}$$

$$A_{K,N} = A_{O,N} - \sum_{i=1}^{L-1} a_{N-i} \cdot \alpha_{K,i}.$$

$$C_K(t) = S_0(t) X \prod_{i=1}^{L-1} s_{i-L\alpha_{K,i}}(t) \quad (0 \le K \le M-1)$$

Instead of using Laurent's pulses, $C_{K,n'}$, we wish to use an alternative pulse, PULSE $K_{K,n'}$, which is as yet unknown, but for which we wish to determine an appropriate value depending upon requisite error function requirements.

Substituting this in equation 1 gives:

$$S_{NT+\Delta T} = \sum_{K=0}^{M-1} \sum_{n'=0}^{L_k-1} J^A K, N-n' \text{PULSE}_{K,n'T+\Delta T} \qquad \text{Equation (2)}$$

where $J=\sqrt{-1}$

As mentioned above, PULSE is unknown as yet, but is, in this embodiment it is read, non zero and of maximum length 8.

In this embodiment we choose to use two components (PULSE [0] and PULSE [1]) to build up S. Hence M=2. Expanding equation (2) for M=2 and replacing the function $A_K$ with a function of the bit streams $\alpha_1, \alpha_2 \ldots$, gives:

$J^{A_{O,N}-5}(J^{(\alpha_{N-4}+\alpha_{N-3}+\alpha_{N-2}+\alpha_{N-1}+\alpha_N)}$Pulse [0][δT]+

$J^{(\alpha_{N-4}+\alpha_{N-3}+\alpha_{N-2}+\alpha_{N-1})}$Pulse [0] [T+δT]+

$J^{(\alpha_{N-4}+\alpha_{N-3}+\alpha_{N-2})}$Pulse [0] [2T+δT]+

$J^{(\alpha_{N-4}+\alpha_{N-3})}$Pulse [0] [3T+δT]+$J^{\alpha_{N-4}}$Pulse [0] [4T+δT]+

Pulse [0][5T+δT]+$J^{(-\alpha_{N-5})}$Pulse [0] [6T+δT]+

$J^{(-\alpha_{N-5}-\alpha_{N-6})}$ Pulse [0][7T+T]+

$J^{(-\alpha_{N-5}-\alpha_{N-6}-\alpha_{N-7})}$ Pulse [0][8T+δT]+

$J^{(\alpha_{N-4}+\alpha_{N-3}+\alpha_{N-2}+\alpha_{N-1}+\alpha_N\alpha-a_{N-1})}$ Pulse [1][δT]+

$J^{(\alpha_{N-4}+\alpha_{N-3}+\alpha_{N-2}+\alpha_{N-3})}$ Pulse [1][T+δT]+

$J^{(\alpha_{N-4}+\alpha_{N-3}+\alpha_{N-2}+\alpha_{N-3})}$ Pulse [1][2T+δT]+

$J^{(\alpha_{N-4}+\alpha_{N-3}-\alpha_{N-4})}$ Pulse [1][3T+δT]+

$J^{(\alpha_{N-4}-N-5)}$ Pulse [1][4T+δT]+$J^{(-\alpha_{N-6})}$ Pulse [1][5T+δT]+

$J^{(-\alpha_{N-5}+\alpha_{N-7})}$ Pulse [1][6T+δT])  Equation (3)

Since $\alpha$ denotes a bit, it must be plus or minus 1. Hence each term in equation (3) can be identified as to whether it is real or imaginary (assuming that the pulse function is real).

eg: Taking the first term of the equation:

$J(\alpha_{N-4}+\alpha_{N-3}+\alpha_{N-2}+\alpha_{N-1}+\alpha_N)$ $\alpha_{N-4}, \alpha_{N-2}, \alpha_N$=odd→imaginary $\alpha_{N-3}, \alpha_{N-1}$=even→real Hence it is possible to calculate the absolute value of this expression as a function of the bits ($\alpha$s). A decision to be made is what $\alpha$ is sent at time N. (In an ideal system this will be the signal received at baseband).

Looking at equation 3 (e.g. for a simple receiver), it can be deduced that the bit $\alpha_{N-4}$ is transmitted at time(N+4)T as it is on its own. It is imaginary, and the interfering (ie other imaginary) pulses must be taken into account. The real terms in this expression can be totally ignored both for the interfering terms and the absolute value of the pulses.

The interference should be minimised. The BER performance can, for example, be improved by making the terms Pulse[0] at (N+4)T large compared to the absolute value of all the other terms.

Therefore, given an $\alpha$ sequence of:

$\{\alpha_N, \alpha_{N-1}, \ldots \alpha_{N-7}\}=\{1,1,1,1,1,1,1,1\}$, the absolute value of the pulse at time $\Delta T$ can be calculated in terms of the unknown pulses. The absolute value of the interfering terms at time $\Delta T$ can also be calculated in terms of the unknown pulses. This is performed for every possible combination of 1,−1 for $\alpha_N$ to $\alpha_7$ (ie all $2^8$=256 possibilities). For each possibility an expression both for interfering terms and absolute value are obtained.

In this embodiment, the pulse is required to meet certain criteria with regard to power, BER, AFC and bandwidth. Hence, error functions for these are determined.

Given an oversampling of 8, $\Delta T$ can take on the following values:

$$\Delta T = \left\{0, \frac{T}{8}, \frac{2T}{8}, \frac{3T}{8} \ldots \frac{7T}{8}\right\}$$

Clearly, the oversampling rate can be altered depending upon the level of pulse sampling required.

The amplitude and BER costs are calculated for $\Delta T$ taking each of the above values. The total cost for each is the addition of all the 8 expressions obtained over the possible sequences.

Cost (Error) Functions (i) Amplitude Error Function

Given a constant amplitude of 1, the error in amplitude can be given by:

{absolute value $^2-1^2\}^2$ (ii) BER Error Function

To calculate this, the amount of noise needs to be determined. This is given by:

{absolute value of interfering regions}$^2$ (iii) Energy Error Function

Required energy–sum of the square of the sample points.

(iv) Bandwidth Error Function

In order to estimate the bandwidth of the pulses, the derivative of the pulse functions (which at this stage are still unknown) are required. This derivative can be approximated as being the difference between two adjacent pulse values. The bandwidth for a pulse, is given by:

sum {derivative at the sample points}$^2$

This can be determined as follows:

A pulse width of 8T has been assumed and we have oversampled the pulse by 8.

According to Laurent:

Pulse [0][t] is non zero for $0 \le t \le 9T$

Pulse [1][t] is non zero for $0 \le t \le 7T$

The unknown pulses are:

$$\text{Pulse}[0]\left[mT + \frac{nT}{8}\right] \text{ for } m = 0, 1, 2...8$$
$$n = 0, 1, 2...7$$

$$\text{Pulse}[1]\left[mT + \frac{nT}{8}\right] \text{ for } m = 0, 1, 2...7$$
$$n = 0, 1, 2...7$$

For convenience denote:

$$\text{Pulse}[0]\left[mT + \frac{nT}{8}\right] \text{ by } x_{0,m\cdot 8+n}$$

$$\text{Pulse}[0]\left[mT + \frac{nT}{8}\right] \text{ by } x_{1,m\cdot 8+n}$$

Then for example:

$$\text{Pulse}[0]\left[2T + \frac{3T}{8}\right] = x_{0,19}$$

$$\text{Pulse}[1]\left[2T + \frac{3T}{8}\right] = x_{1,19}$$

Adjacent sample points have adjacent numbers and the set of unknowns becomes:

$X_{0,i}$ where i=0,1,2 . . . 71 and $X_{1,i}$ where i=0,1,2 . . . 55

Consequently, the approximate bandwidths for pulse [0] is as follows:

$$\text{Pulse}[0]: \text{Sum}\frac{(x_{0,i+1} - x_{0,i})^2}{T/8} \text{ for } i = 0 \text{ to } 70 \quad (a)$$

In the present embodiment, the bandwidth for the second component is to be determined, then a similar expression needs to be determined for PULSE [1]. This is as follows:

$$\text{Pulse}[1]: \text{Sum}\frac{(x_{1,i+1} - x_{0,i})^2}{T/8} \text{ for } i = 0 \text{ to } 54 \quad (b)$$

Total bandwidth for the pulse composed of the two components (a)+(b)

The pulse can be specifically designed based on system requirements by weighting the above error functions (for example 0.3 for power, 0.3 for BER and 0.4 for bandwidth or if a system requires only, for example, bandwidth considerations, 0 for power and BER and 1 for bandwidth). More weight can be added to whatever is causing a problem. The only restriction is that the total weighting must equal +1.

Now the total error function is expressed in terms of the unknowns, namely, $X_{0,i}$(i=0 to 71) and $X_{i,j}$(i=0 to 55). To determine appropriate values for the unknowns, and thus deduce the pulse shapes, this expression is minimised using a conventional off-the-shelf optimiser, for example.

The implementation of a pulse function defined in dependence on desired cost parameters (eg by the above method) will now be described.

Conventional transmitters can still be used. However, as shown in the embodiments of FIGS. 2 and 3, the carrier generator 105a, 105b of the conventional transmitter, which provides a Gaussian signal (for GSM)/root raised cosine signal (for CDMA) in the frequency domain, is replaced with a clock 205 and a look up table 206 comprising data for adaptively shaping the pulse function to compensate for component distortion. In this embodiment, the data of the look up table also adaptively shapes the pulse function to meet other cost function requirements. This enables the modulator type to differ from the type conventionally used by a particular telecommunication system. For example, in the GSM transmitter of FIG. 2, the modulator may be a GMSK modulator, as is conventional. However, alternatively, it may be a QPSK modulator. Similarly, in the CDMA transmitter of FIG. 3, the modulator 304 may be a QPSK modulator as is generally used in CDMA systems such as IS95. However, alternatively, it may be a continuous phase modulator such as that used in MSK modulation. The bandwidth of the signal output by the modulator 204, 304 is related to the spectrum of the pulses that are used to make up the lookup table 206, 306.

For the further evolution of GSM (EDGE), it has been proposed to improve the data rate by 3 by changing the modulation scheme. The present invention enables the data rate to be increased by designing a pulse which meets the appropriate cost functions. Consequently, the existing infrastructure can be used with its channels divided either in frequency or time.

Figure 7:
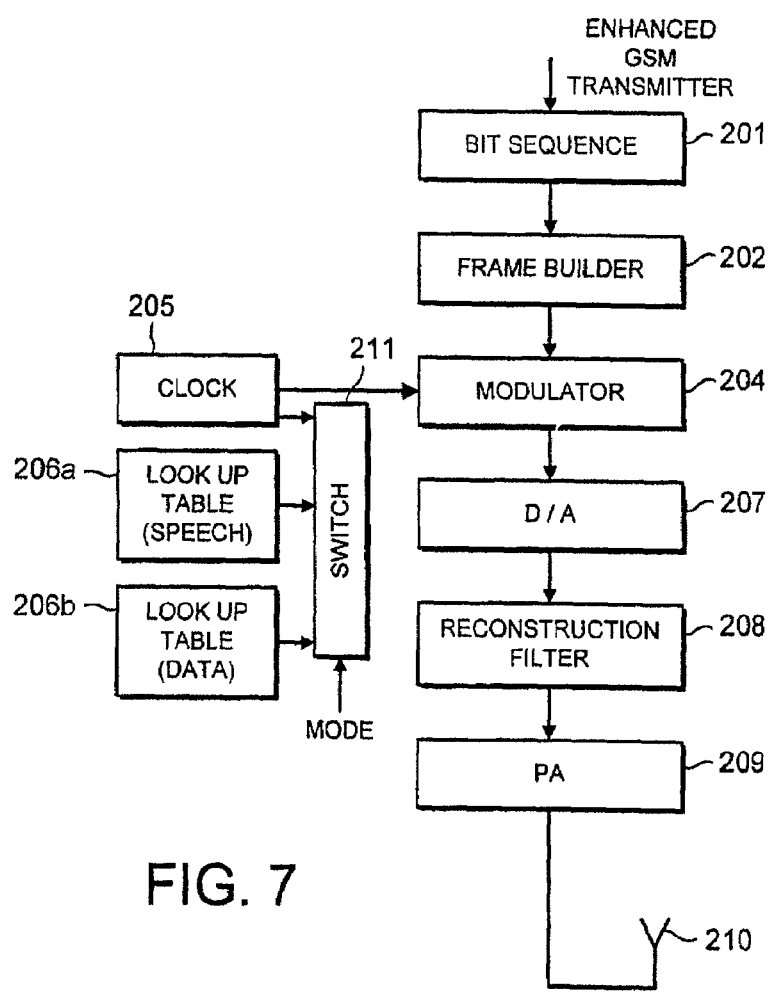
FIG. 7 is an enhanced GSM transmitter according to an embodiment of the present invention.

FIG. 7 shows an enhanced GSM transmitter which could be used in such a system. This transmitter is similar to present GSM transmitters, and in this embodiment the modulator 204 is an MSK modulator. However, this enhanced GSM transmitter comprises 2 lookup tables 206a and 206b, which define different pulse functions for acting on the bit sequence 201. Lookup table 206a comprises data defining a pulse function which can act on speech with the current data rate of 9.6 kilobits per second. The data of this lookup table could correspond to the Gaussian curve, so that it provides the same modulation (ie GMSK) as is currently used in GSM. However, preferably, it comprises data defining a pulse function according to the present invention, for example one which is optimised for a more stringent cost function and provides predistortion.

Lookup table 206b, on the other hand, comprises data which defines a pulse function for acting on the bit sequence 201 for data applications. The pulse function is designed based on different cost functions from the ones required for the voice applications, as clearly data applications require a much improved data rate. Switch 211 provides connection between the modulator and the appropriate lookup table for the application required.

As mentioned previously, flexibility of choice of modulation scheme for a particular telecommunication system has been restricted due to the modulation schemes having certain efficiencies and inefficiencies tied to them. However, by removing these ties by providing a suitable pulse shape which meets the cost function requirements of a certain system, the present invention provides greater flexibility.

Figure 8:
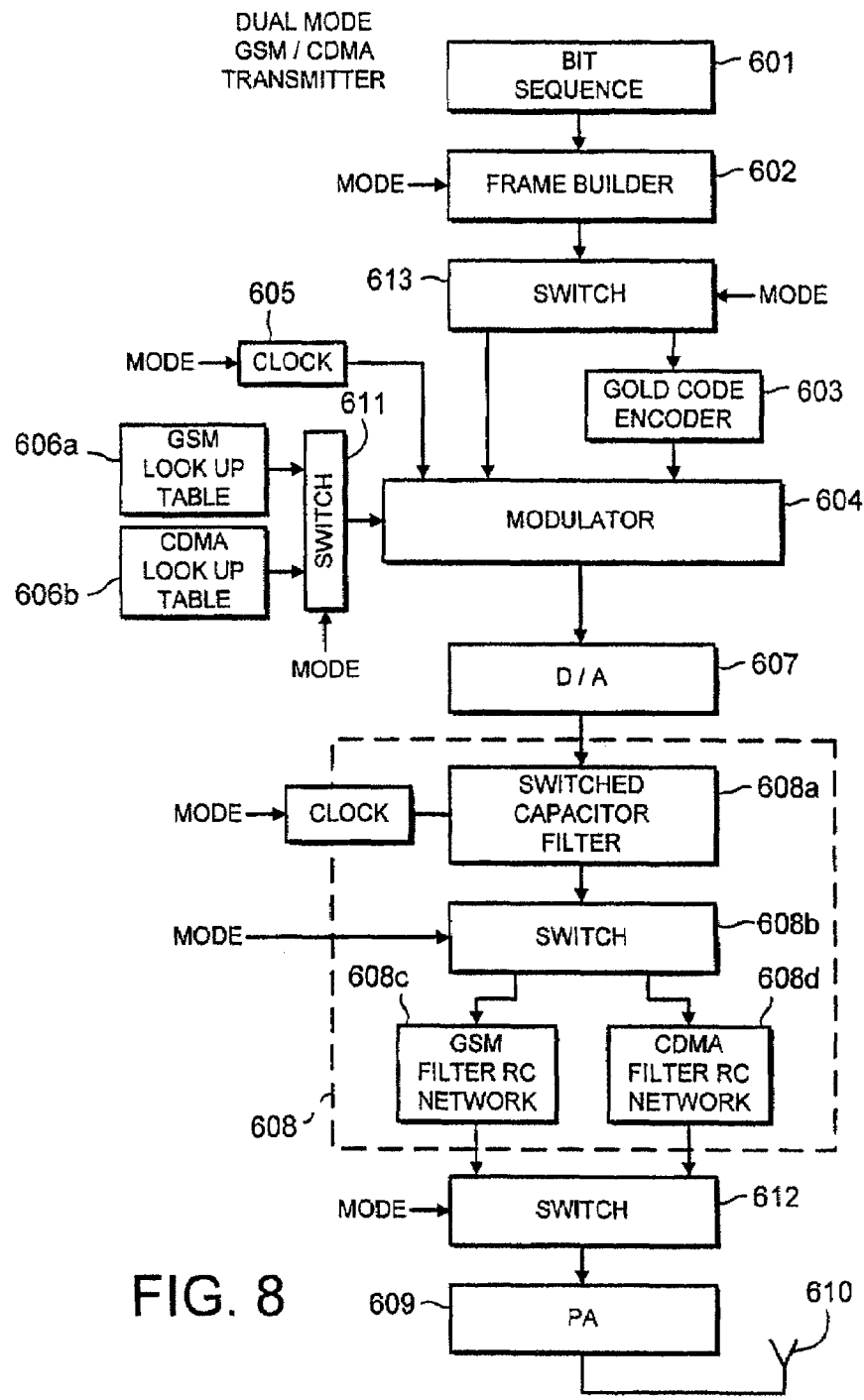
FIG. 8 is a dual mode GSM/CDMA transmitter according to an embodiment of the present invention.

FIG. 8 shows a dual mode GSM/CDMA transmitter. This transmitter is provided with a common modulator 604. This is possible because the cost function restraints of a particular modulation scheme have been reduced by the transmitter having two lookup tables 606a and 606b, which, in this embodiment respectively define pulse shapes which meet the cost function requirements of GSM and CDMA and provide compensation for transmitter component distortion.

As can be seen a number of components can be used for both GSM and CDMA operations and where two components are required a switch is included, the switch between them depending on the operation of the transmitter. For example, if in CDMA mode the bit sequence 601 would need to be encoded by a gold code encoder 603. Hence the switch would make a connection with this gold code encoder, whereas if in GSM mode it would switch straight through to the modulator. Similarly if in GSM mode, the pulse shaping is provided by GSM lookup table 606a and switch 611 provides a connection so a bit sequence can be shaped according to the data in this lookup table. Finally switch 612 is provided so that the power amplifier is connected to the filter network for the appropriate mode of operation of the transmitter.

Figure 9:
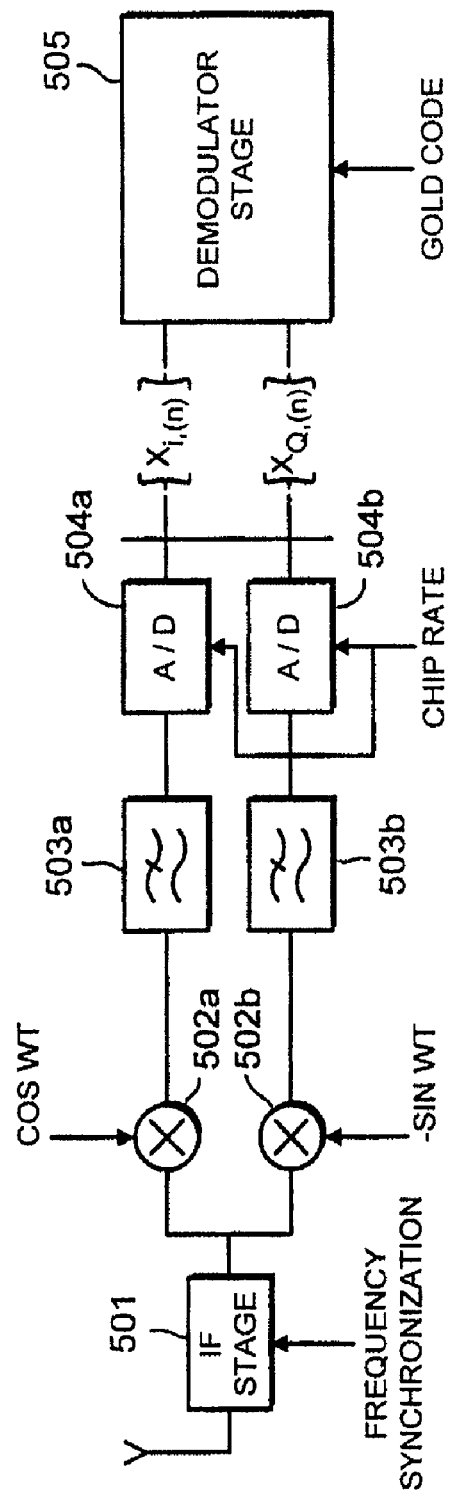
FIG. 9 is a receiver which can be used in accordance with the present invention.

FIG. 9 shows a typical receiver. A received signal is put through at least 1 IF stage 501 to reduce its frequency to a base band frequency and then the signal is split into its I and Q components and the carrier is removed from the signal, using mixers 502a and 502b and low pass filters 503a and 503b. The signal is then converted from an analogue signal into a digital signal by the A/D converters 504a and 504b and forwarded to the Demodulator stage 505. At this stage, demodulation, any equalisation, and decoding etc is performed.

Figure 10A:
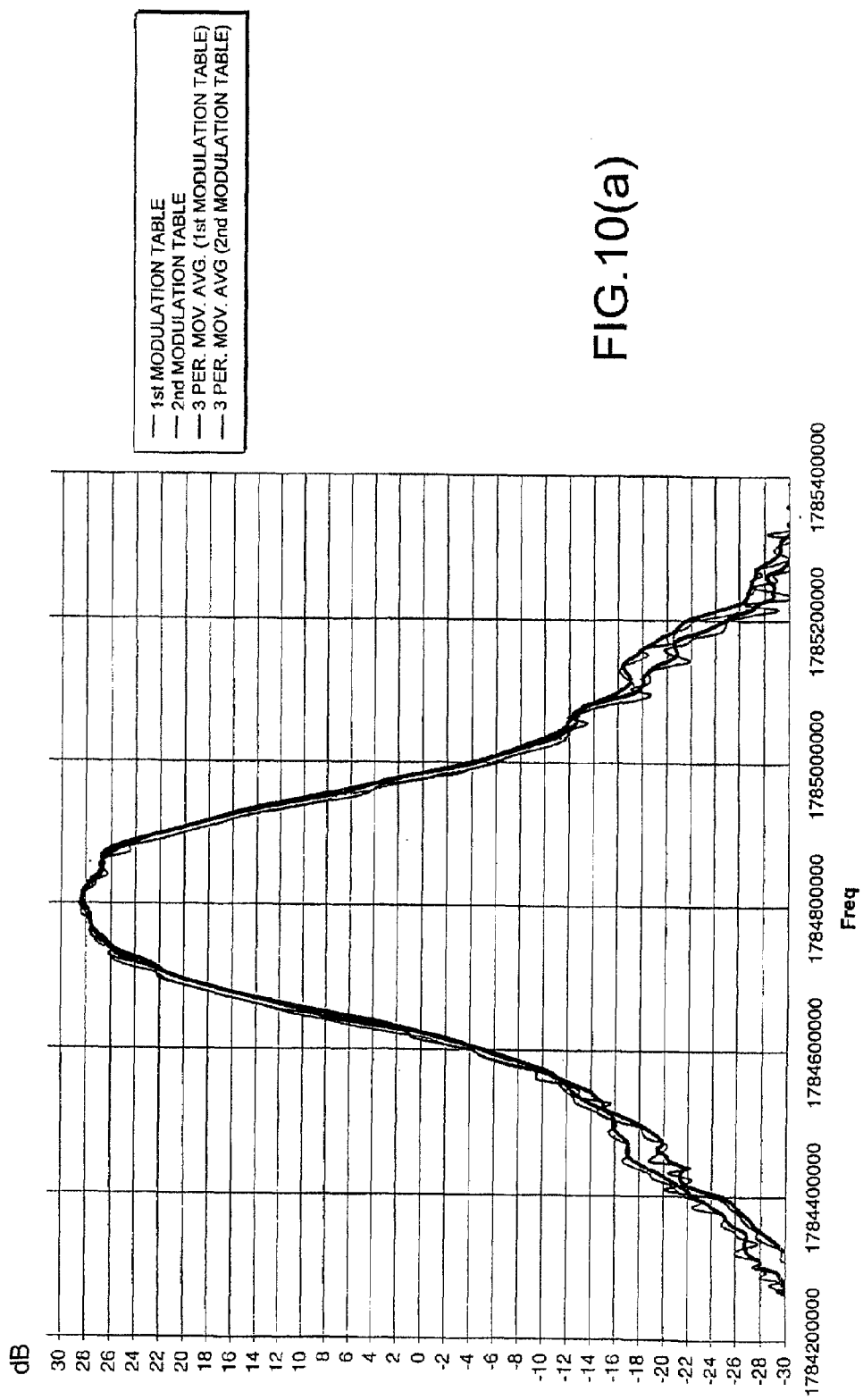
FIG. 10a illustrates the shape of pulses compensating for component distortion.
Figure 10B:
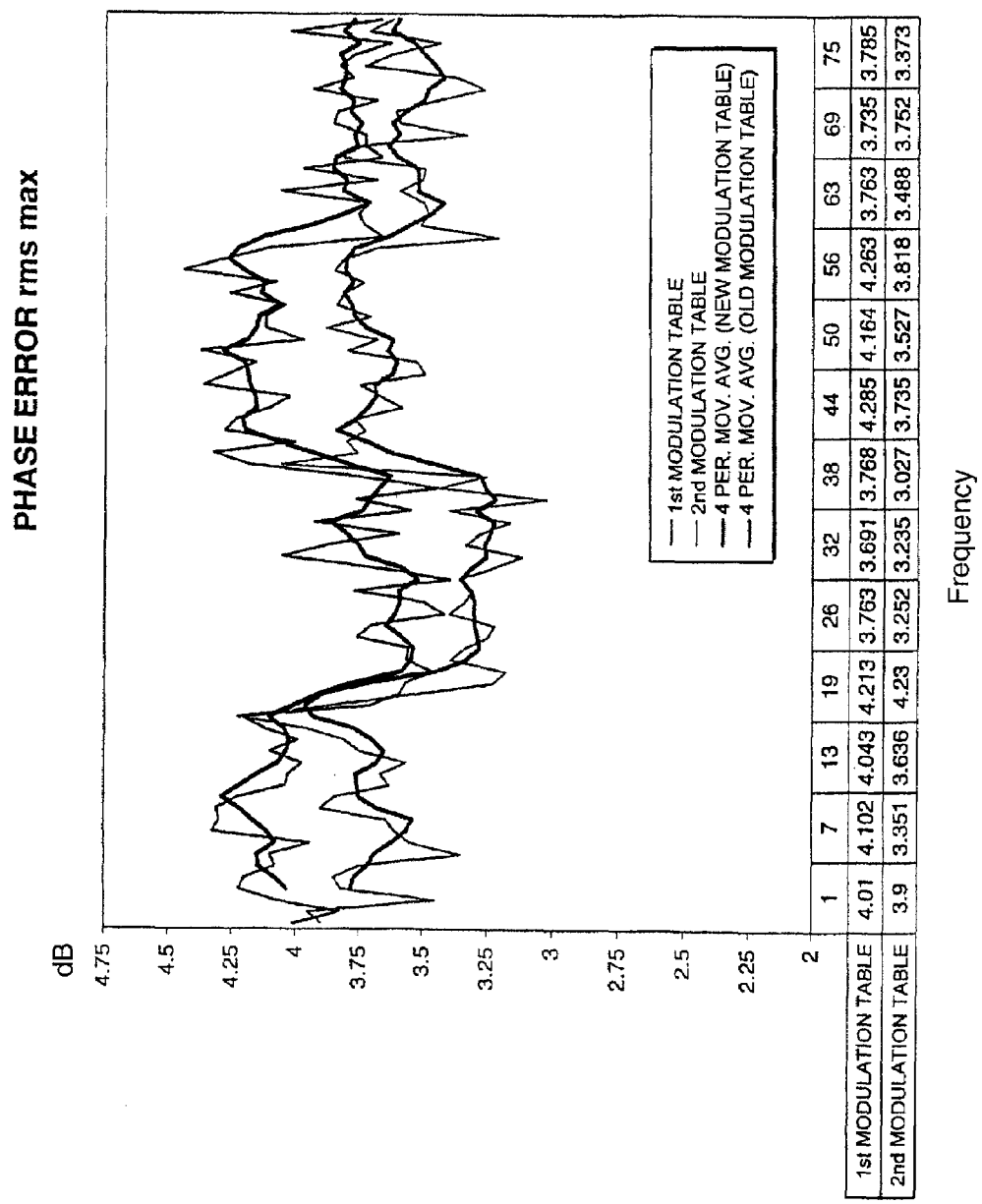
FIG. 10b illustrates the phase noise for those pulses.

FIGS. 10(a) and (b) show how a pulse shape can be determined according to the present invention which compensates for component distortion without increasing the phase error. The first modulation table provides a pulse function which compensates for distortion by a linear component (reconstruction filter) and the second modulation table provides a pulse function which also compensates for distortion by a power amplifier. These pulse shapes could be stored in a look up table of a phone such as the Nokia 5100 and 6100 series (e.g. 5110, 5130, 6130, 6150).

The present invention includes any novel feature or combination of features disclosed herein either explicitly or any generalisation thereof irrespective of whether or not it relates to the claimed invention or mitigates any or all of the problems addressed.

In view of the foregoing description it will be evident to a person skilled in the art that various modifications may be made within the scope of the invention.

Annex 1 which is on the file of this application is hereby incorporated by reference.

What is claimed is:

1. A method for defining the relationship between frequency and amplitude of a pulse function modulating a data stream for transmission in a telecommunications system in accordance with a predetermined modulation scheme to compensate for distortion by a component of the transmitter, wherein the telecommunications system has desired criteria for respective associated cost parameters, and the pulse function for modulating is determined by:
  defining cost functions representing the deviation of a respective one of the cost parameters from the associated desired system criterion; and
  defining the amplitude of the pulse function over a range of frequencies in dependence on the cost functions and the distortion for which compensation is to be made.

2. A method as claimed in claim 1, wherein the compensation is for non linear distortion.

3. A method as claimed in claim 2, wherein defining the distortion to be compensated for comprises defining first and second distortions.

4. A method as claimed in claim 3, wherein the first and second distortions relate to different component tolerances.

5. A method as claimed in claim 3, wherein the method comprises weighting the first and second distortions.

6. A method as claimed in claim 2, wherein the compensation is for distortion by a non linear component of the transmitter.

7. A method as claimed in claim 6, wherein the compensation is for distortion by a power amplifier.

8. A method as claimed in claim 1, wherein the compensation is for distortion by a linear component of the transmitter.

9. A method as claimed in claim 8, wherein the compensation is for distortion by a reconstruction filter.

10. A method for defining the relationship between frequency and amplitude of a pulse function for acting on a data stream for transmission in a telecommunications system for compensate for distortion by first and second components of the transmitter, the method comprising:
  the method of any preceding claim for defining the amplitude of the pulse function over a range of frequencies in dependence on the desired cost parameters for the first component;
  defining the cost parameters for the second component on the basis of the distortion to be compensated for in the second component; and
  defining the amplitude of the pulse function over a range of frequencies in dependence upon the distortion functions of the second component and the pulse function defined for the first component.

11. A method as claimed in claim 10, wherein the compensation for distortion by the second component is compensation for non linear distortion.

12. A method as claimed in claim 11, wherein the compensation is for distortion by a non linear component of the transmitter.

13. A method according to claim 1, wherein the desired cost parameters are selected from one or more of the group including component tolerances, power efficiency, spectral efficiency, bit error rate, AFC, and energy.

14. A method as claimed in claim 1, wherein desired cost parameters are defined on the basis of TDMA telecommunications system requirements.

15. A method as claimed in claim 14, wherein the pulse function is defined such that a pulse of Gaussian shape may be transmitted.

16. A method as claimed in claim 1, wherein desired cost parameters are defined on the basis of GSM requirements.

17. A method as claimed in claim 1, wherein desired cost parameters are defined on the basis of CDMA requirements.

18. A method as claimed in claim 17, wherein the pulse function is defined such that a pulse of the root raised cosine shape may be transmitted.

19. A method according to claim 1, wherein the amplitude of the pulse function over a range of frequencies is defined in an iterative process in which the pulse function is altered and the cost parameters determined until an acceptable balance of cost parameters is achieved.

20. A method according to claim 1, wherein the method comprises the step of weighting the respective cost parameters.

21. A method according to claim 20, wherein an acceptable balance between the cost parameters is achieved by optimizing the respective costs with the respective weightings.

22. A method according to claim 21, wherein the optimization is performed using an optimizer computer program.

23. A dual mode communication device operable in a first mode when a first set of cost parameters are desired and in a second mode when a second set of cost parameters are desired, the communication device comprising:
- a first pulse function generator for converting a data stream in accordance with a pulse function shaped in dependence on the first set of desired cost parameters;
- a second pulse function generator for converting a data stream in accordance with a pulse function shaped in dependence on the second set of desired cost parameters; and
- means for selecting the pulse function generator in accordance with the mode of operation of the communication device;
- wherein at least one of the pulse functions is shaped in accordance with the relationship defined by the method of claim 1.

24. A communication device as claimed in claim 23, which is operable at a first data rate in the first mode and a second data rate in the second mode.

25. A communication device as claimed in claim 23, wherein the first data rate supports voice applications and the second data rate supports data applications.

26. A method for selecting a modulation scheme for a communication system using a predetermined transmitter, the method comprising:
- defining a pulse function for a first modulation scheme in accordance with the method as claimed in claim 1;
- defining a pulse function for a second modulation scheme for the same desired cost parameters;
- determining the resultant cost parameters for each scheme; and
- selecting the modulation scheme which gives resultant cost parameters given desired cost parameters.

27. A pulse function generator arranged to convert a data stream in accordance with a pulse function shaped by defining the relationship between frequency and amplitude of a pulse function which modulates the data stream for transmission in a telecommunications system for compensating for distortion by a component of a transmitter, wherein the telecommunications system has desired criteria for respective associated cost parameters, the pulse function generator comprising:
- means for defining cost functions representing the deviation of a respective one of the cost parameters from the associated desired system criterion; and
- means for defining the amplitude of the pulse function over a range of frequencies in dependence on the cost functions and the distortion for which compensation is to be made.

28. A modulator for providing a signal for transmission in a telecommunication system comprising:
the pulse function generator of claim 27 for shaping a data stream.

29. A modulator according to claim 28, wherein the pulse function generator comprises a look-up table.

30. A transceiver for a communication device comprising a modulator in accordance with claim 28 and a demodulator.

31. A communication device operable in communication system comprising a transceiver according to claim 30.

32. A dual mode communication device operable in a first mode in a TDMA telecommunications system in which a channel is a combination frequency and a timeslot and a second mode in a CDMA telecommunications system, comprising a modulator for modulating a data stream with a carrier signal in accordance with a predetermined modulation scheme in both the first and the second modes of operation and a pulse function generator for shaping a data stream in accordance with respective pulse functions responsive to the mode of operation of the communication device and distortion by a component of the transmitter.

33. A dual mode communication device operable in a first mode when a first set of cost parameters are desired and in a second mode when a second set of cost parameters are desired, the dual mode communication device comprising:
- a modulator for modulating a data stream with a carrier signal in accordance with a predetermined modulation scheme in both the first and second modes of operation;
- a first pulse function generator for shaping a data stream in accordance with a pulse function shaped in dependence on the first set of desired cost parameters and distortion by a component of the transmitter;
- a second pulse function generator for shaping a data stream in accordance with a pulse function shaped in dependence on the second set of desired cost parameters and distortion by a component of the transmitter; and
- means for selecting one of the pulse function generators in accordance with the mode of operation of the communication device.

* * * * *

UNITED STATES PATENT AND TRADEMARK OFFICE
CERTIFICATE OF CORRECTION

| | | |
|---|---|---|
| PATENT NO. | : 7,274,747 B1 | Page 1 of 4 |
| APPLICATION NO. | : 09/625201 | |
| DATED | : September 25, 2007 | |
| INVENTOR(S) | : Lobo | |

It is certified that error appears in the above-identified patent and that said Letters Patent is hereby corrected as shown below:

<u>Column 2</u>, beginning with Line 48 through <u>Column 3</u>, Line 46, the specification should read as follows:

--The present invention may be used to compensate for one or plurality of components. This method reduces the mathematical complexity in determining the level of distortion to be compensated for by two components. In a preferred embodiment, the telecommunication system is GSM, the first component is a reconstruction filter and the second a non-linear power amplifier. In this case, firstly the pulse function required for compensation of the reconstruction filter is determined, and then a second pulse function which would result in the reconstruction filter compensation pulse function is compensating for the power amplifier.

Desired cost parameters may be defined on the basis of a number of telecommunication system requirements, including TDMA and CDMA. One type of TDMA system is GSM, and a pulse function may be defined according to the method of the present invention such that a conventionally shaped Gaussian pulse may be transmitted. Alternatively, the pulse function may be defined to take other cost functions into account.

Similarly, for CDMA, the pulse function may be defined conventionally such that a pulse of a root raised cosine shape may be transmitted, or alternatively the pulse function may be defined to take other cost functions into account.

According to another aspect of the present invention, the defined pulse function is generated by a pulse function generator.

According to a further aspect of the present invention, a modulator is provided which comprises means for shaping a data stream in accordance with the defined pulse function.

The means for shaping a data stream advantageously comprises a look-up table.

According to other aspects of the present invention, there is provided a transceiver for a communication device comprising such a modulator and a demodulator, and a communication device, comprising such a transceiver.

According to a still further aspect, there is provided a dual mode communication device operable in a first mode in a TDMA telecommunications system in which a channel is a combination of frequency and timeslot and a second mode in a CDMA telecommunications system, comprising a modulator for modulating a data stream with a carrier signal in accordance with a predetermined modulation scheme in both the first and second modes of operation and a pulse function generator for shaping a data stream in accordance with respective pulse functions responsive to the mode of operation of the radio telephone and distortion by a component of the transmitter.--.

UNITED STATES PATENT AND TRADEMARK OFFICE
CERTIFICATE OF CORRECTION

PATENT NO. : 7,274,747 B1
APPLICATION NO. : 09/625201
DATED : September 25, 2007
INVENTOR(S) : Lobo It is certified that error appears in the above-identified patent and that said Letters Patent is hereby corrected as shown below:

Column 2, beginning with Line 48 through Column 3, Line 46, the specification should read as follows (continued):

--According to another aspect, there is provided a dual mode communication device operable in a first mode when a first set of cost parameters are desired and in a second mode when a second set of cost parameters are desired, the radiotelephone comprising:
a first pulse function generator for converting a data stream in accordance with a pulse function shaped in dependence on the first set of desired cost parameters;
a second pulse function generator for converting a data stream in accordance with a pulse function shaped in dependence on the second set of desired cost parameters; and means for selecting the pulse function generator in accordance with the mode of operation of the phone;
wherein at least one of the pulse functions is shaped in accordance with the relationship defined by any of the above methods.--.

Column 4, beginning with Line 11 through the word "improves" in Column 5, Line 18, the specification should read as follows:

--determining the resultant cost parameters for each scheme; and
selecting the modulation scheme which gives good resultant cost parameters given the desired ones. In prior art modulation schemes, the pulse functions used to shape the data streams have had a predefined mathematical relationship.

For example:
root raised cosine $$H(f) = 1 \qquad |f| < \alpha$$

$$H(f) = \sqrt{\frac{1}{2}(1 - \cos(2\Pi(f - (T + \alpha)))} \qquad \alpha < |f| \leq T + \alpha$$

$$= 0 \qquad |f| > T + \alpha$$

for CDMA systems in which QPSK modulation is used and PDC and NADC systems in which DQPSK modulation is used.--.

UNITED STATES PATENT AND TRADEMARK OFFICE
CERTIFICATE OF CORRECTION

PATENT NO. : 7,274,747 B1
APPLICATION NO. : 09/625201
DATED : September 25, 2007
INVENTOR(S) : Lobo It is certified that error appears in the above-identified patent and that said Letters Patent is hereby corrected as shown below:

Column 4, beginning with Line 11 through the word "improves" in Column 5, Line 18, the specification should read as follows (continued):

--Gaussian $$H(f) = \frac{1}{\sqrt{2\Pi}\sigma} e^{-f^2/2a^2}$$

for GSM in which an MSK modulation scheme is used.
With pulse shapes according to the conventional predefined mathematical relationships only one parameter is variable for a given energy level. For the gaussian pulse this is 'sigma' that varies the spread of the pulse allowing the bandwidth to alter at the expense of amplitude. For the root raised cosine the variable is 'alpha' that varies the frequency at which the cosine tail begins. This effects the bandwidth and consequently the power efficiency. The relationship between the cost parameters is well defined so as one improves the other declines in a determined fashion. That is, there is no scope for altering the bandwidth without the detriment of power inefficiency.
Because of the severe restrictions placed on the trade-offs achievable by varying the single variable for the predetermined mathematical functions, the pulse shape most appropriate for each modulation scheme is quite clear. The system designer conventionally makes a decision on which modulation scheme based on its strengths and weaknesses and selects the appropriate pulse shape based solely on that chosen modulation scheme (i.e. a Gaussian for GMSK and a root raised cosine for QPSK). He does not take distortion of the ideal pulse shape into account when determining the modulation scheme to be used. The single variable of the mathematical function is set to provide an acceptable balance in the defined relationship between the cost parameters.
In the present invention, there is no predetermined mathematical relationship for the pulse shaper. The shape of the pulse is defined in order to compensate for distortion by one or more transmitter components. There is freedom to select new pulse shapes that compensate for distortion so that the transmitter can transmit a signal of appropriate (potentially ideal) shape for the chosen modulation scheme, such as a Gaussian or root raised cosine.
In a preferred embodiment, pulse shapes may be chosen which provide for compensation, and furthermore allow many cost parameters to be balanced against each other since the trade-off relationship between two parameters is no longer defined so restricted. This leads to a number of interesting possibilities, which will outlined below.--.

UNITED STATES PATENT AND TRADEMARK OFFICE
CERTIFICATE OF CORRECTION

PATENT NO. : 7,274,747 B1
APPLICATION NO. : 09/625201
DATED : September 25, 2007
INVENTOR(S) : Lobo It is certified that error appears in the above-identified patent and that said Letters Patent is hereby corrected as shown below:

Column 4, beginning with Line 11 through the word "improves" in Column 5, Line 18, the specification should read as follows (continued):

--With this preferred embodiment of the present invention, it is not necessary for the pulse shape in MSK to be gaussian. Although this particular pulse--.

Signed and Sealed this

Thirteenth Day of May, 2008

JON W. DUDAS
*Director of the United States Patent and Trademark Office*